United States Patent
Komatsu et al.

(10) Patent No.: US 10,680,404 B2
(45) Date of Patent: Jun. 9, 2020

(54) OPTICAL SUBASSEMBLY, OPTICAL MODULE, AND OPTICAL TRANSMISSION EQUIPMENT

(71) Applicant: Lumentum Japan, Inc., Sagamihara, Kanagawa (JP)

(72) Inventors: Kazuhiro Komatsu, Tokyo (JP); Michihide Sasada, Kanagawa (JP)

(73) Assignee: Lumentum Japan, Inc., Kanagawa (JP)

( * ) Notice: Subject to any disclaimer, the term of this patent is extended or adjusted under 35 U.S.C. 154(b) by 0 days.

(21) Appl. No.: 15/935,315

(22) Filed: Mar. 26, 2018

(65) Prior Publication Data

US 2018/0278014 A1 Sep. 27, 2018

(30) Foreign Application Priority Data

Mar. 27, 2017 (JP) .................. 2017-061136

(51) Int. Cl.

| | |
|---|---|
| H01S 5/024 | (2006.01) |
| H05K 7/20 | (2006.01) |
| G02B 6/42 | (2006.01) |
| H01S 5/022 | (2006.01) |
| H04B 10/50 | (2013.01) |

(52) U.S. Cl.
CPC ...... *H01S 5/02469* (2013.01); *H01S 5/02208* (2013.01); *H01S 5/02248* (2013.01); *H01S 5/02296* (2013.01); *H01S 5/02492* (2013.01); *H04B 10/501* (2013.01); *G02B 6/4269* (2013.01); *G02B 6/4272* (2013.01); *H01S 5/02216* (2013.01); *H01S 5/02276* (2013.01); *H01S 5/02284* (2013.01); *H05K 7/20445* (2013.01)

(58) Field of Classification Search
CPC ..... G02B 6/4266–4273; H01S 5/02469; H01S 5/02208; H01S 5/02248; H01S 5/02296; H01S 5/02492; H01S 5/02216; H01S 5/02276; H01S 5/02284; H04B 10/501; H05K 7/2039–2049
USPC .................... 361/704–715; 165/80.1–80.3
See application file for complete search history.

(56) References Cited

U.S. PATENT DOCUMENTS

| | | | | |
|---|---|---|---|---|
| 6,821,030 | B2 * | 11/2004 | Fukuda ............... | G02B 6/4201 385/88 |
| 7,539,233 | B2 * | 5/2009 | Teramura .............. | G02B 7/025 372/107 |

(Continued)

FOREIGN PATENT DOCUMENTS

JP 2015-096878 A 5/2015

*Primary Examiner* — Zachary Pape
(74) *Attorney, Agent, or Firm* — Harrity & Harrity, LLP

(57) ABSTRACT

To provide an optical subassembly, an optical module, and an optical transmission equipment including simpler components. A first component with an optical semiconductor device mounted thereon that dissipates heat generated by the optical semiconductor device to outside, a second component in contact with the first component to form a box type housing, and a receptacle terminal that optically joined to the optical semiconductor device are provided, wherein the second component includes a window structure for transmitting light transmitted between the optical semiconductor device and the receptacle terminal, and the receptacle terminal is fused and fixed to the outside of the window structure.

20 Claims, 4 Drawing Sheets

(56) References Cited

U.S. PATENT DOCUMENTS

| | | | | |
|---|---|---|---|---|
| 8,644,357 | B2* | 2/2014 | Liu | H01S 5/02236 |
| | | | | 372/36 |
| 8,774,568 | B2* | 7/2014 | Han | G02B 6/4206 |
| | | | | 385/14 |
| 9,548,817 | B1* | 1/2017 | Nagarajan | H04B 10/501 |
| 2003/0214031 | A1* | 11/2003 | Onoue | H01S 5/02415 |
| | | | | 257/734 |
| 2004/0184753 | A1* | 9/2004 | Teramura | G02B 6/4248 |
| | | | | 385/128 |
| 2012/0141121 | A1* | 6/2012 | Itoh | H04B 10/294 |
| | | | | 398/34 |
| 2015/0136957 | A1 | 5/2015 | Iemura et al. | |
| 2018/0149818 | A1* | 5/2018 | Yamauchi | G02B 6/4204 |

\* cited by examiner

PRIOR ART

OPTICAL SUBASSEMBLY, OPTICAL MODULE, AND OPTICAL TRANSMISSION EQUIPMENT

CROSS-REFERENCE TO RELATED APPLICATION

The present application claims priority from Japanese application JP 2017-061136, filed on Mar. 27, 2017, the content of which is hereby incorporated by reference into this application.

BACKGROUND OF THE INVENTION

1. Field of the Invention

This invention relates to an optical subassembly, an optical module, and an optical transmission equipment including a plurality of optical semiconductor devices, and specifically relates to an optical subassembly including simpler components.

2. Description of the Related Art

Optical subassemblies (OSA) including optical semiconductor devices are used. The optical subassembly described in JP 2015-096878 A is a box type optical subassembly and the box is hermetically enclosed using an inert gas for maintaining characteristics of the optical semiconductor device.

SUMMARY OF THE INVENTION

Regarding the box type optical subassembly of the related art, an optical semiconductor device and a control integrated circuit are mounted on a box type package, and a receptacle terminal to be optically coupled to the optical semiconductor device is fused and fixed to the outside of the box type package.

FIG. 4 is a perspective view showing a structure of an optical subassembly 201 according to the related art. For understanding of the structure of the optical subassembly 201, apart of a casing 210 (case) on the section along the center line is shown. As shown in FIG. 4, the casing 210 as a box main body and a cover 219 as a lid form a box type housing. A base 211 on which a plurality of components are mounted is mounted on the bottom of the casing 210. Here, on the base 211, a control integrated circuit 212 (IC), an optical semiconductor device 213, and a lens 214 are mounted. Further, for external electrical connection, a printed circuit board 215 is placed to penetrate the side surface of the casing 210, and a part of the printed circuit board 215 is placed on the bottom of the casing 210. A plurality of terminals (not shown) provided on one end of the control integrated circuit 212 (IC) (end at the optical semiconductor device 213 side) and a plurality of terminals (or a plurality of electrodes: not shown) provided on the optical semiconductor device 213 are respectively electrically connected via a plurality of wires 216A. A plurality of terminals (not shown) provided at the other end of the control integrated circuit 212 (IC) (end at the printed circuit board 215 side) and a plurality of terminals (not shown) provided on the printed circuit board 215 are respectively electrically connected via a plurality of wires 216B. A window 217 for transmitting light is provided in the side surface of the casing 210, and a receptacle terminal 218 is aligned with the transmitted light and is fused and fixed to the outside of the window 217. Note that the hermetically-enclosed box type housing is formed by the casing 210 and the cover 219 of the optical subassembly 201 shown in FIG. 4, and hermetically enclosed using an inert gas for maintaining reliability of the optical semiconductor device 213 to be mounted.

Recently, further cost reduction has been desired for optical subassemblies. For the purpose, it is desirable to further simplification of the structure of the optical subassembly and reduction of the number of components. The base 211 is mounted on the bottom of the casing 210 and the casing 210 and the base 211 are thermally connected. It is necessary to sufficiently release the heat generated in the control circuit 212 and the optical semiconductor device 213 mounted on the base 211.

The invention has been achieved in view of the above described problem, and is intended to provide an optical subassembly, an optical module, and an optical transmission equipment including simpler components.

(1) To solve the problem, an optical subassembly according to the invention includes a first component with an optical semiconductor device mounted thereon that dissipates heat generated by the optical semiconductor device to outside, a second component in contact with the first component to form a box type housing, and a receptacle terminal that optically joined to the optical semiconductor device, wherein the second component includes a window structure for transmitting light transmitted between the optical semiconductor device and the receptacle terminal, and the receptacle terminal is fused and fixed to the outside of the window structure.

(2) In the optical subassembly according to (1), a material of the first component and a material of the second component may be different.

(3) In the optical subassembly according to (1) or (2), thermal conductivity of the material of the first component may be higher than thermal conductivity of the material of the second component.

(4) In the optical subassembly according to any one of (1) to (3), an integrated circuit for controlling the optical semiconductor device may be further mounted on the first component, and the first component may dissipate heat generated by the integrated circuit to outside.

(5) In the optical subassembly according to any one of (1) to (4), the first component may have a shape containing a front surface and side surfaces at both sides, and the front surface and the side surfaces at both sides of the first component and inner walls of the second component may be secured in contact via adhesives.

(6) In the optical subassembly according to (4), the box type housing may have an opening portion and may further include a printed circuit board placed through the opening portion and electrically connected to the integrated circuit, and the printed circuit board may be placed through the box type housing, and thereby, the box type housing may not hermetically be enclosed.

(7) In the optical subassembly according to any one of (1) to (6), a gap between the printed circuit board and the opening portion may be filled with a resin.

(8) An optical module according to the invention may include the optical subassembly according to any one of (1) to (7).

(9) An optical transmission equipment according to the invention may include the optical module according to (8) mounted thereon.

According to the invention, an optical subassembly, an optical module, and an optical transmission equipment including simpler components are provided.

DETAILED DESCRIPTION OF THE INVENTION

As below, embodiments of the invention will be specifically explained in detail with reference to the drawings. Note that, in all of the drawings for explanation of the embodiments, the members having the same functions have the same signs and overlapping description thereof will be omitted. The following drawings are for explanation of the examples of the embodiments, and sizes of the drawings and scaling in the description of the examples do not necessarily coincide.

First Embodiment

Figure 1:
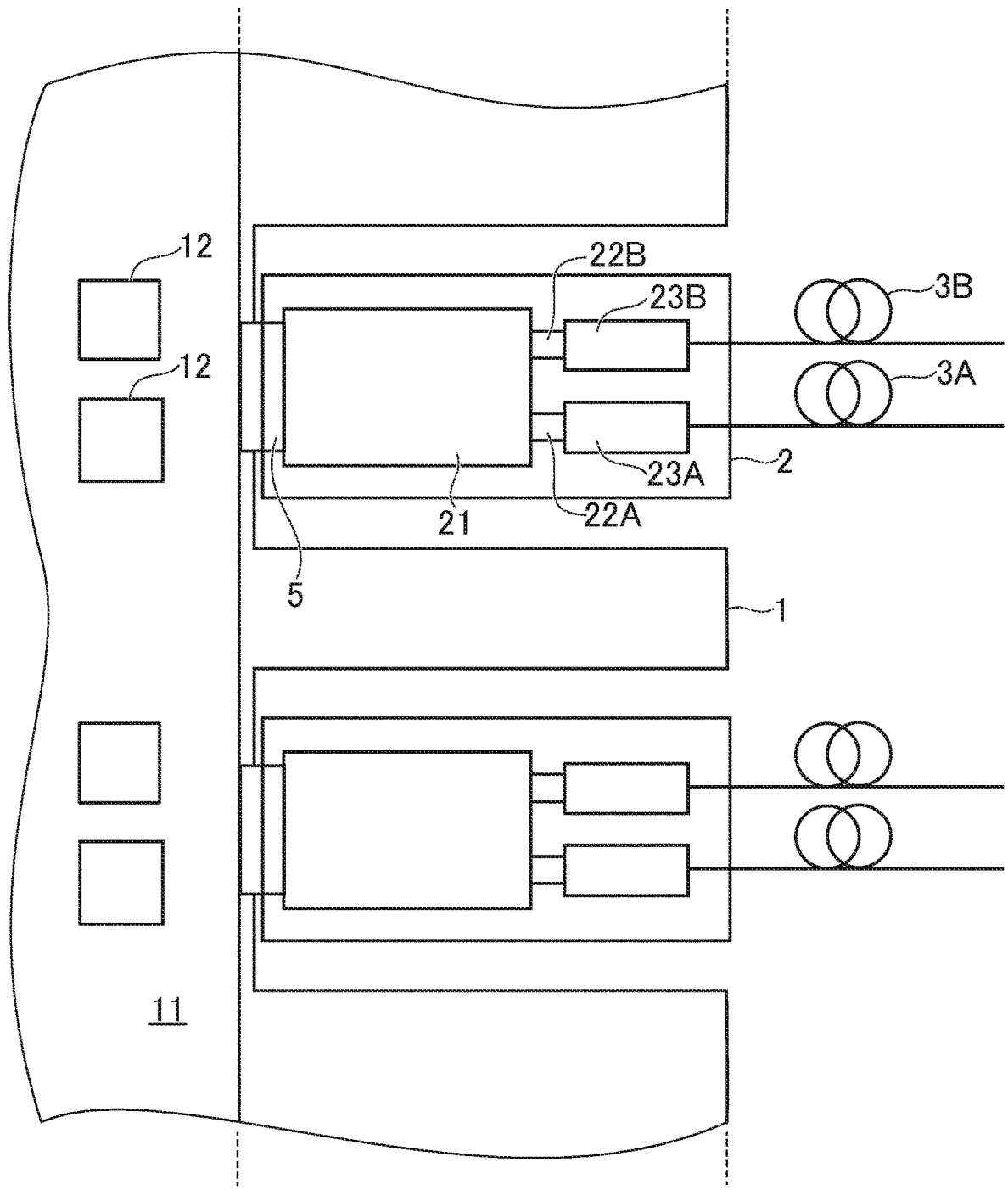
FIG. 1 is a schematic diagram showing configurations of an optical transmission equipment and an optical module according to a first embodiment of the invention.

FIG. 1 is a schematic diagram showing configurations of an optical transmission equipment 1 and an optical module 2 according to the first embodiment of the invention. The optical transmission equipment 1 includes a printed circuit board 11 and an IC 12. The optical transmission equipment 1 is e.g. a high-volume router or switch. The optical transmission equipment 1 has e.g. a function of a switching equipment and placed in a base station or the like. The optical transmission equipment 1 has a plurality of optical modules 2 mounted thereon, and acquires reception data (reception electric signals) from the optical modules 2, determines the destination and data to transmit using the IC 12 or the like, generates transmission data (transmission electric signals), and transmits the data to the corresponding optical modules 2 via the printed circuit board 11.

The optical module 2 is a transceiver having a function of the optical transmitting and a function of the optical receiving. The optical module 2 includes a printed circuit board 21, an optical receiver module 23A that converts a received optical signal into an electric signal via an optical fiber 3A and an optical transmitter module 23B that coverts an electric signal into an optical signal and transmits the signal to an optical fiber 3B. The printed circuit board 21 and the optical receiver module 23A and the optical transmitter module 23B are connected via flexible boards 22A, 22B (FPCs: Flexible Printed Circuits), respectively. The electric signal is transmitted from the optical receiver module 23A via the flexible board 22A to the printed circuit board 21, and the electric signal is transmitted from the printed circuit board 21 via the flexible board 22B to the optical transmitter module 23B. The optical module 2 and the optical transmission equipment 1 are connected via an electric port 5. The optical receiver module 23A and the optical transmitter module 23B are electrically connected to the printed circuit board 21 and converts an optical signal into an electric signal and an electric signal into an optical signal, respectively.

A transmission system according to the embodiment includes two or more optical transmission equipments 1, two or more optical modules 2, and one or more optical fibers 3 (e.g. 3A, 3B). One or more optical modules 2 are connected to each optical transmission equipment 1. The optical fibers 3 connect between the optical modules 2 respectively connected to the two optical transmission equipments 1. The transmission data generated by one optical transmission equipment 1 is converted into an optical signal by the connected optical module 2, and the optical signal is transmitted to the optical fiber 3. The optical signal transmitted on the optical fiber 3 is received by the optical module 2 connected to the other optical transmission equipment 1, and the optical module 2 converts the optical signal into an electric signal and transmits the signal as reception data to the other optical transmission equipment 1.

Figure 2:
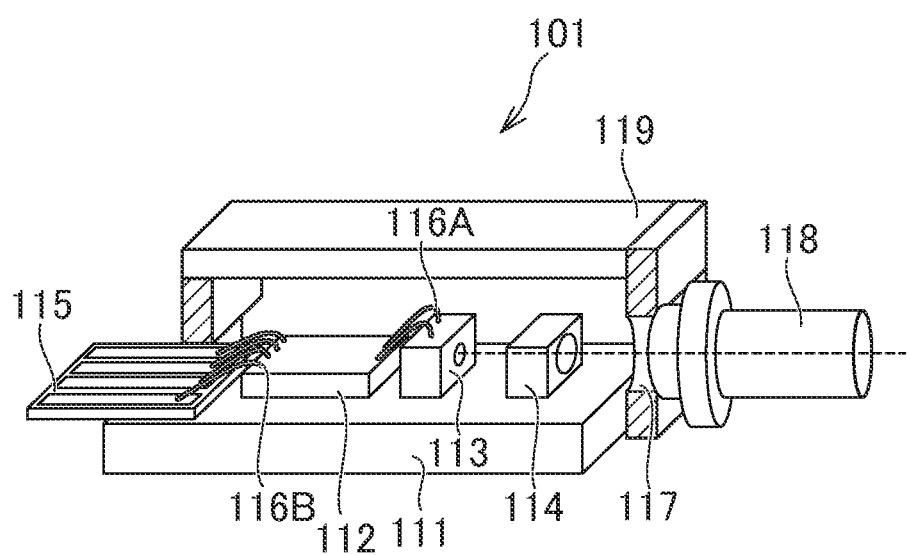
FIG. 2 is a perspective view showing a structure of an optical subassembly according to the first embodiment of the invention.
Figure 4:
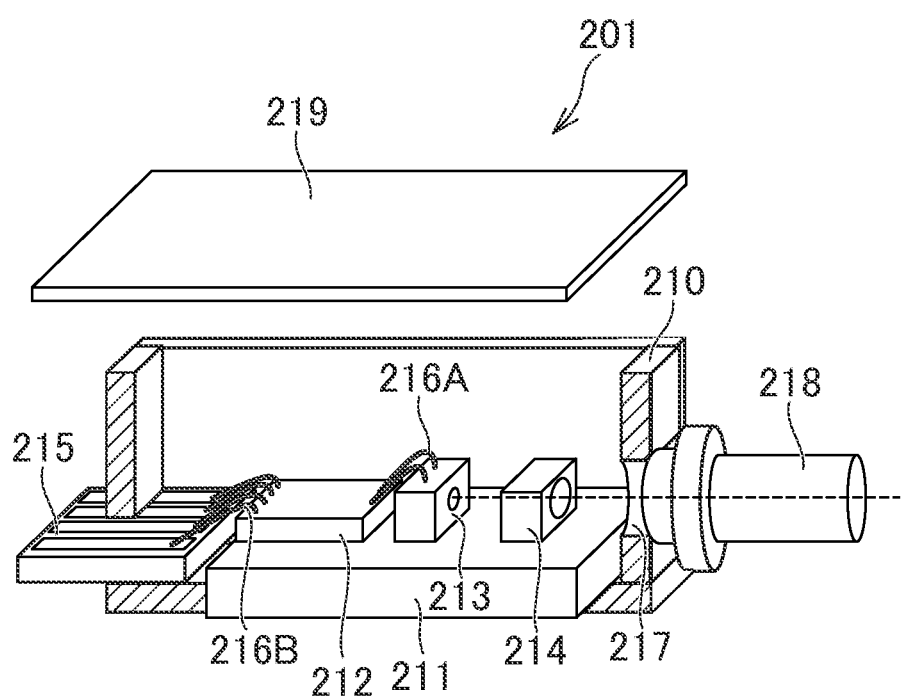
FIG. 4 is a perspective view showing a structure of an optical subassembly according to a related art.

FIG. 2 is a perspective view showing a structure of an optical subassembly 101 according to the embodiment. Like FIG. 4, for understanding of the structure of the optical subassembly 101, a part of an enclosure 119 (case) on the section along the center line is shown. The optical receiver module 23A (or optical transmitter module 23B) shown in FIG. 1 includes one or more optical subassemblies 101. Unlike the optical subassembly 201 shown in FIG. 4, the optical subassembly 101 according to the embodiment shown in FIG. 2 forms a box type housing with a base 111 (first component) and the enclosure 119 (second component). On the base 111, a plurality of components are mounted, and here, a control integrated circuit 112 (IC), an optical semiconductor device 113, a lens 114, and a printed circuit board 115 are mounted. The optical semiconductor device 113 is an optical device that photoelectrically converts one of an optical signal and an electric signal into the other. The optical subassembly 101 according to the embodiment is a ROSA (Receiver Optical Sub-Assembly) and the optical semiconductor device 113 is a light-receiving element such as a PD (Photo Diode). The light-receiving element photoelectrically converts an optical signal into an electric signal. The control integrated circuit 112 is an IC having a transimpedance amplifier (TIA) function here. However, the optical subassembly 101 according to the embodiment is not limited to the ROSA, but may be a TOSA (Transmitter Optical Sub-Assembly) and, in this regard, the optical semiconductor device 113 is an LD (Laser Diode), i.e., semiconductor laser. Further, the control integrated circuit 112 is a driver IC. The semiconductor laser includes, but not limited to such a light-emitting element, and may be another light-emitting element. The light-emitting element photoelectrically converts an electric signal into an optical signal. Or, the optical subassembly 101 according to the embodiment may be a BOSA (Bidirectional Optical SubAssembly).

The base 111 is a sub-mount for use as a heatsink for heat dissipation of the heat generated by the control integrated circuit 112 and the optical semiconductor device 113 to the outside of the housing. For the purpose, as the material forming the base 111, a material having higher thermal conductivity is selected and, here, the material is CuW-10 (a composite material of 10% of copper and 90% of tungsten). That is, the base 111 is formed using the material having higher thermal conductivity and has lower thermal resistance. On the other hand, the enclosure 119 is a cover-type case, and the base 111 and the enclosure 119 are in contact with each other for external hermetical enclosure except a part. Heat dissipation is not required for the enclosure 119 and, here, the material forming the enclosure 119 is special use stainless steel (SUS). That is, the thermal conductivity of the material of the base 111 is higher than the thermal conductivity of the material of the enclosure 119. Thus, the thermal resistance of the base 111 is lower than the thermal resistance of the enclosure 119.

The base 111 has a plate shape containing a top surface, a bottom surface, a front surface, side surfaces at both sides (two side surfaces), and a back surface. The front surface and the side surfaces at both sides of the base 111 and the inner walls of the enclosure 119 are secured in contact via adhesives. The base 111 and the enclosure 119 are sufficiently secured with at least three surfaces in contact by the adhesives, and thereby, axis misalignment after optical axis adjustment may be prevented.

The enclosure 119 includes a window 117 (window structure) in the side surface thereof (side surface at the connection side to the optical fiber outside). The optical subassembly 101 further includes a receptacle terminal 118 optically joined to the optical semiconductor device 113. Through the window 117 provided in the enclosure 119, the light transmitted between the optical semiconductor device 113 and the receptacle terminal 118 may be passed. The receptacle terminal 118 is formed using SUS and fused and fixed to the outside of the window 117 by YAG welding or the like. By the fusion and fixation, the enclosure 119 and the receptacle terminal 118 may suppress the axis misalignment after optical axis adjustment. Further, the receptacle terminal 118 is optically connected to an external optical fiber (not shown) by e.g. a ferrule. When the optical semiconductor device 113 is a light-receiving element, the light (optical signal) transmitted from the optical fiber through the receptacle terminal 118 is output from the receptacle terminal 118. The light passes through the window 117, is transmitted through the box type housing, collected by the lens 114, and enters the optical semiconductor device 113. When the optical semiconductor device 113 is a light-emitting element, the light (optical signal) output from the optical semiconductor device 113 is collected by the lens, passes through the window 117, and enters the receptacle terminal 118. The light is transmitted through the receptacle terminal 118 and output to the optical fiber.

The box type housing formed by the base 111 and the enclosure 119 in contact with each other has an opening portion in the opposite side surface to the side surface in which the receptacle terminal 118 is placed. The printed circuit board 115 is placed through the opening portion and a part of the printed circuit board 115 is placed on the top surface of the base 111. Here, the printed circuit board 115 is e.g. a flexible board. The printed circuit board 115 is electrically connected to the control integrated circuit 112 (IC). A plurality of terminals (not shown) provided on one end of the control integrated circuit 112 (end at the optical semiconductor device 113 side) and a plurality of terminals (or a plurality of electrodes: not shown) provided on the optical semiconductor device 113 are respectively electrically connected via a plurality of wires 116A. A plurality of terminals (not shown) provided on the other end of the control integrated circuit 112 (end at the printed circuit board 115 side) and a plurality of terminals (not shown) provided on the printed circuit board 115 are respectively electrically connected via a plurality of wires 116B.

Regarding the optical subassembly 101 according to the embodiment, the box type housing is formed by the base 111 on which the plurality of optical components are mounted and the enclosure 119, and thereby, the optical subassembly may be formed using simpler components. Further, regarding the optical subassembly 101 according to the embodiment, the base 111 forms a part of the box type housing, and thereby, most of the heat generated from the control integrated circuit 112 and the optical semiconductor device 113 may be dissipated to the outside of the housing via the base 111, and the structure better in heat dissipation is obtained. On the other hand, the housing has the opening portion and a gap between the printed circuit board 115 and the opening portion, and is not hermetically enclosed. The optical subassembly 101 according to the embodiment has the structure with an emphasis on the heat dissipation above hermeticity. Particularly, the invention is most appropriate for the control integrated circuit 112 being an IC (CDR-IC) having a CDR (Clock and Data Recovery) function because the amount of heat generated by the control integrated circuit 112 is higher. The part between the printed circuit board 115 and the opening portion may be filled with a resin and hermeticity may be improved.

The method of manufacturing the optical subassembly 101 according to the embodiment is as follows. First, all of the above described components are prepared. Second, the plurality of components are mounted on the base 111. Here, the plurality of components include the control integrated circuit 112, the optical semiconductor device 113, the lens 114, and the printed circuit board 115. The lens 114 is placed while the optical semiconductor device 113 is driven and active alignment is performed so that the lens may be fixed in the optimal position. Third, the optical semiconductor device 113 and the control integrated circuit 112, the control integrated circuit 112 and the printed circuit board 115 are connected via the wires 116A, 116B, respectively. Fourth, the base 111 with the plurality of components mounted thereon and the enclosure 119 are secured by the adhesives. Fifth, when the optical semiconductor device 113 is a light-receiving element, a light-emitting element (some light source) is connected to an external optical fiber, the light-emitting element is driven, the optical axis alignment of the receptacle terminal 118 is performed so that the sensitivity of reception by the optical semiconductor device 113 may be maximum (or a sufficiently high value), and then, they are fused and fixed by YAG welding. The optical axis from the optical semiconductor device 113 to the lens 114 is fixed on the base 111 as described above. The optical axis to the base 111 and the window 117 of the enclosure 119 is fixed by bonding of the base 111 and the enclosure 119. In this case, the base 111 and the enclosure 119 are bonded in a wider area, and axis misalignment after optical axis fixation is less likely. Then, the window 117 and the receptacle terminal 118 are secured by fusion. They can be secured by an adhesive, however, the securement area is smaller and the optical axis may be out of alignment due to changes with age of the adhesive. Accordingly, securement with fusion with smaller changes with age is preferable. In the embodiment, SUS is used for the materials of the enclosure 119 and the receptacle terminal 118 for fusion. In the case of formation using CuW better in heat dissipation like the base 111 in place of SUS, fusion is impossible. On the other hand, when SUS is used for the base 111, heat dissipation is not sufficient to be able to solve the problem of the invention. Therefore, in the embodiment, CuW is used with an emphasis on heat dissipation for the base 111 and SUS is used with an emphasis on fusion (prevention of optical axis misalignment) above heat dissipation for the receptacle terminal 118.

Note that the optical subassembly 101 according to the embodiment includes, but not limited to, the single optical semiconductor device 113 and the single lens 114 (i.e., single channel). The optical subassembly 101 (i.e., multi-channel) in which a plurality of optical semiconductor devices 113 and a plurality of lenses respectively corresponding thereto are mounted on the base 111 may be employed. For example, the bit rate of the electric signal received or transmitted by the optical subassembly 101 is 100 Gbit/s. The optical subassembly 101 is compliant with the CFP standards and may be DWDM (Dense Wavelength Division Multiplexing) system that performs four-wavelength multiplexing of light at 25 Gbit/s at wavelength intervals of 4.5 nm and transmits the light at 100 Gbit/s.

Second Embodiment

Figure 3:
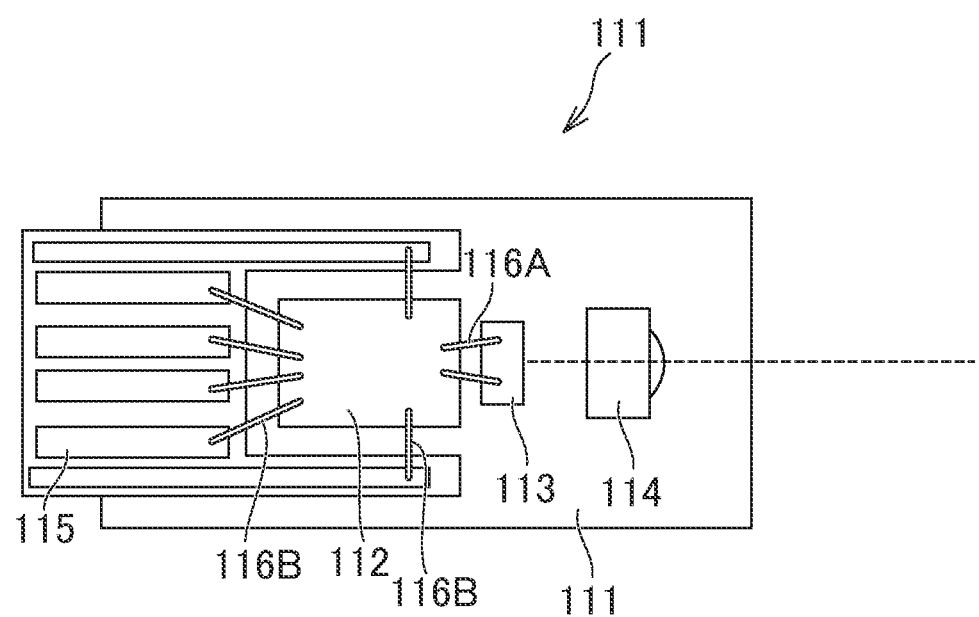
FIG. 3 is a schematic diagram showing a configuration of an optical subassembly according to a second embodiment of the invention.

FIG. 3 is a schematic diagram showing a configuration of an optical subassembly 101 according to the second embodiment of the invention. FIG. 3 shows the top surface of the base 111 of the optical subassembly 101. The optical subassembly 101 according to the embodiment is different from the first embodiment in the configuration of the printed circuit board 115, however, has the same structures as those of the rest. The printed circuit board 115 according to the embodiment is a flexible board. As shown in FIG. 3, the printed circuit board 115 is branched to right and left in an end portion at the connection side to the control integrated circuit 112 and extends along both sides of the control integrated circuit 112 to surround the control integrated circuit 112. When the control integrated circuit 112 has a rectangular shape in the plan view, the printed circuit board 115 may be placed closer to at least three sides on the rectangle. The control integrated circuit 112 and the printed circuit board 115 are electrically connected via the plurality of wires 116B. In the optical subassembly 101 according to the embodiment, even when the number of wires 116B increases, the lengths of the wires 116B may be maintained to be shorter and many wires 116B may be placed because the proximity area of the control integrated circuit 112 to the printed circuit board 115 increases. Particularly, the embodiment is most appropriate for the case where the optical subassembly 101 include a plurality of optical semiconductor devices 113 (multichannel) and the number of terminals of the control integrated circuit 112 increases.

As above, the optical subassembly, the optical module, and the optical transmission equipment according to the embodiment of the invention are described. In the embodiments, the base 111 has the plate shape, however, the shape is not limited as long as the shape contains the front surface and the side surfaces at both sides. To shorten the lengths of the plurality of wires 116A for connecting the plurality of terminals of the control integrated circuit 112 and the plurality of terminals of the optical semiconductor device 113, the base 111 may have a stepped shape containing a first upper surface on which the control integrated circuit 112 is mounted and a second upper surface on which the optical semiconductor device 113 is mounted. Here, the first upper surface is in the higher position than the second upper surface and the bottom surface. In this case, the shape of the enclosure 119 is determined according to the shape of the base 111. Further, the connection surfaces between the base 111 and the enclosure 119 are not necessarily all of the side surfaces at both sides of the base 111, but may be e.g. only parts extending downward from the edges at both sides of the first upper surface. Furthermore, the control integrated circuit may be placed outside of the OSA. The invention may be widely applied to an optical assembly that exerts the effects of the invention.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An optical subassembly comprising:
a first component with an optical semiconductor device and an integrated circuit mounted directly on an upper surface of the first component;
a second component in contact with the first component to form a box type housing having an opening portion, wherein the second component is made of different materials than the first component;
a receptacle terminal that is optically joined to the optical semiconductor device; and
a flexible board placed through the opening portion and mounted directly on the upper surface of the first component,
wherein the flexible board is electrically connected to the optical semiconductor device via the integrated circuit,
wherein the first component dissipates heat, generated by the optical semiconductor device and the integrated circuit, outward from the box type housing,
wherein the second component has a front side opposed to the opening portion and includes a window structure on the front side for transmitting light between the optical semiconductor device and the receptacle terminal,
wherein the receptacle terminal is fused and fixed to the window structure, and
wherein the box type housing is not hermetically enclosed due to the flexible board being placed through the opening portion.

2. The optical subassembly according to claim 1, wherein thermal conductivity of a material of the first component is higher than thermal conductivity of a material of the second component.

3. The optical subassembly according to claim 1, wherein the integrated circuit is configured to control the optical semiconductor device.

4. The optical subassembly according to claim 1, wherein the first component has a shape containing a front surface and side surfaces at both sides, and
wherein the front surface, the side surfaces, and inner walls of the second component are secured in contact via adhesives.

5. The optical subassembly according to claim 1, wherein a gap between the flexible board and the opening portion is filled with a resin.

6. The optical subassembly according to claim 1, wherein the optical semiconductor device is configured to:
convert a first optical signal to a first electric signal, and
convert a second electrical signal to a second optical signal.

7. The optical subassembly according to claim 1, further comprising:
a lens, mounted on the first component, configured to collect the light transmitted between the optical semiconductor device and the receptacle terminal.

8. An optical module comprising:
an optical subassembly comprising:
a first component with an optical semiconductor device and an integrated circuit mounted directly on an upper surface of the first component;
a second component in contact with the first component to form a box type housing having an opening portion,
wherein the second component is made of different materials than the first component;

a receptacle terminal that is optically joined to the optical semiconductor device; and a flexible board placed through the opening portion and mounted directly on the upper surface of the first component, wherein the flexible board is electrically connected to the integrated circuit, wherein the optical semiconductor device is electrically connected to the integrated circuit, wherein the first component dissipates heat, generated by the optical semiconductor device and the integrated circuit, outward from the box type housing, and wherein the second component has a front side opposed to the opening portion and includes a window structure on the front side for transmitting light between the optical semiconductor device and the receptacle terminal.

9. The optical module according to claim 8, wherein thermal conductivity of a material of the first component is higher than thermal conductivity of a material of the second component.

10. The optical module according to claim 8, wherein the integrated circuit is configured to control the optical semiconductor device.

11. The optical module according to claim 8, wherein the first component has a shape containing a front surface and side surfaces at both sides, and wherein the front surface, the side surfaces, and inner walls of the second component are secured in contact via adhesives.

12. The optical module according to claim 8, wherein a gap between the flexible board and the opening portion is filled with a resin.

13. The optical module according to claim 8, further comprising:

a lens, mounted on the first component, configured to collect the light transmitted between the optical semiconductor device and the receptacle terminal.

14. The optical module according to claim 8, wherein the optical semiconductor device is configured to:

convert a first optical signal to a first electric signal, and convert a second electrical signal to a second optical signal.

15. An optical transmission equipment comprising:

an optical module comprising:

a first component with an optical semiconductor device and an integrated circuit mounted directly on an upper surface of the first component;

a second component in contact with the first component to form a box type housing having an opening portion, wherein the second component is made of different materials than the first component;

a receptacle terminal that is optically joined to the optical semiconductor device; and a flexible board placed through the opening portion and mounted directly on the upper surface of the first component, wherein the flexible board is electrically connected to the integrated circuit, wherein the optical semiconductor device is electrically connected to the integrated circuit, wherein the first component dissipates heat, generated by the optical semiconductor device and the integrated circuit, outward from the box type housing, wherein the second component has a front side opposed to the opening portion and includes a window structure on the front side for transmitting light between the optical semiconductor device and the receptacle terminal, wherein the receptacle terminal is fused and fixed to the window structure, and wherein the box type housing is not hermetically enclosed due to the flexible board being placed through the opening portion.

16. The optical transmission equipment according to claim 15, wherein thermal conductivity of a material of the first component is higher than thermal conductivity of a material of the second component.

17. The optical transmission equipment according to claim 15, wherein the integrated circuit is configured to control the optical semiconductor device.

18. The optical transmission equipment according to claim 15, wherein the first component has a shape containing a front surface and side surfaces at both sides, and wherein the front surface, the side surfaces, and inner walls of the second component are secured in contact via adhesives.

19. The optical transmission equipment according to claim 15, wherein a gap between the flexible board and the opening portion is filled with a resin.

20. The optical transmission equipment according to claim 15, further comprising:

a lens, mounted on the first component, configured to collect the light transmitted between the optical semiconductor device and the receptacle terminal.

* * * * *